United States Patent
Morikawa et al.

[11] Patent Number: 5,796,118
[45] Date of Patent: Aug. 18, 1998

[54] PHOTODETECTION SEMICONDUCTOR DEVICE

[75] Inventors: Takenori Morikawa; Tsutomu Tashiro, both of Tokyo, Japan

[73] Assignee: NEC Corporation, Tokyo, Japan

[21] Appl. No.: 777,350

[22] Filed: Dec. 27, 1996

[30]  Foreign Application Priority Data

Jan. 25, 1996  [JP]  Japan ..................... 8-010899

[51]  Int. Cl.$^6$ ........................................ H01L 29/06
[52]  U.S. Cl. ................ 257/19; 257/21; 257/22; 257/432; 257/436; 257/466; 257/616
[58]  Field of Search ..................... 257/19, 21, 22, 257/432, 436, 452, 458, 466, 616

[56]  References Cited

U.S. PATENT DOCUMENTS 5,576,221  11/1996  Takemura et al. ............... 257/19

FOREIGN PATENT DOCUMENTS 7-231113  8/1995  Japan.

OTHER PUBLICATIONS

B. Jalali, "Si–Based Receivers for Optical Data Links", *IEEE Journal of Lightwave Technology*, vol. 12, No. 6, Jun. 1994, pp. 930–935.

A. Splett et al., "Integration of Waveguides and Photodetectors in SiGe for 1.3 μm Operation", *IEEE Photonics Technology Letters*, vol. 6, No. 1, Jan. 1994, pp. 59–61.

*Primary Examiner*—Minh-Loan Tran
*Attorney, Agent, or Firm*—Young & Thompson

[57]  ABSTRACT

A photodetection semiconductor device is constructed in such a manner that a photodiode light absorbing layer includes an Si/SiGe super-lattice layer (6), which forms a layer in parallel with the surface of a silicon substrate (1), and upper and lower P type low Ge concentration SiGe epitaxial layers (5) and (7), which sandwich the Si/SiGe super-lattice layer between them and contain Ge lower than a Ge content in the Si/SiGe super-lattice layer, a highly dense P+ type Si contact layer (8) is directly formed on the upper SiGe epitaxial layer (7) and a highly dense N+ type epitaxial layer (2) is formed immediately below the lower SiGe epitaxial layer (5). Preferably, Ge concentration in each of the upper and lower SiGe epitaxial layers (5) and (7) is set to be at least 1% or higher.

7 Claims, 8 Drawing Sheets

PHOTODETECTION SEMICONDUCTOR DEVICE

BACKGROUND OF THE INVENTION

1. Field of the Invention

The present invention relates to a semiconductor device for photodetection, which is formed on a silicon substrate.

2. Description of the Related Art

A light receiver having sensitivity at a 1.3 µm wavelength band is necessary in order to perform very high-speed and long distance optical fiber communication. A light receiver using compounds such as GaAs and the like has heretofore principally been utilized. However, use of SiGe having sensitivity at a 1.3 µm wavelength band for a light absorbing layer now realizes a low cost light receiver, to which a silicon process can be applied. For example, photodiodes using SiGe were reported in pp. 930 to 935 of "Journal of Lightwave Technology" (by B. Jalali and et al., in 1994) and in pp. 59 to 61 of "IEEE Photonics Technology Letter, Vol. 6, No. 1" (by A. Splett and et al., in January, 1994).

These photodiodes are manufactured by growing a highly dense impurity layer as an electrode and etching this in a mesa form after growing a light absorbing layer as an super-lattice structure, which is formed by alternately laying Si and SiGe over the other. Direct growing of thick SiGe on Si is difficult due to grid misalignment. However, the super-lattice structure enables the light absorbing layer of SiGe to be large in its general film thickness, increasing its light absorbing rate.

FIG. 1 is a section view showing the structure of a photodetector developed by B. Jalali and et al. Referring to FIG. 1, a reference numeral 61 represents an N+ silicon substrate; 62, an i-type Si epitaxial layer; 63, an i-type Si/SiGe super-lattice layer; 64, an i-type Si epitaxial layer; 65, a P+ type Si epitaxial layer; 66, a silicon oxide film; and 67, an aluminum electrode.

For this photodetector, an optical waveguide is formed in such a manner that the i type Si epitaxial layer 62 is formed on the N+ type silicon substrate 61, and then after formation of the i-type Si/SiGe super-lattice layer 63, the i-type Si epitaxial layer 64 and the P+ type Si epitaxial layer 65. The P+ type Si epitaxial layer 65, the i-type Si epitaxial layer 64 and the i-type Si/SiGe super-lattice layer 63 are etched to be a mesa form.

FIG. 2 is a section view showing the structure of a photodetector developed by A. Splett and et al. Referring to FIG. 2, a reference numeral 71 represents a P type silicon substrate; 72, a P type SiGe epitaxial layer; 73, an i type Si/SiGe super-lattice layer; 74, a P type Si buffer layer; 75, an N+ type Si contact layer; 76, a silicon oxide film; and 77, an aluminum electrode.

For this photodetector, an optical waveguide is formed to be rib-like in such a manner that the i-type Si/SiGe super-lattice layer 73, the P type Si buffer layer 74 and the N+ type Si contact layer 75 are formed after formation of the P type SiGe epitaxial layer 72 on the P type silicon substrate 71. The N+ type Si contact layer 75, the P type Si buffer layer 74 and the i-type Si/SiGe super-lattice layer 73 are etched to be a mesa form so as to reach the P type SiGe epitaxial layer 72.

Each of these photodiodes is a mesa type photodiode, on which a light is made incident from the side of a silicon chip end. Since the light absorbing layer of SiGe is thin, being a total of about 1 µm, even when the super-lattice layer is used, it is necessary to efficiently guide a light from an optical fiber having a core diameter of 10 µm to the light absorbing layer.

In the case of the photodetector developed by B. Jalai and et al., a light is directly made incident on the cleaved surface of the mesa type photodiode. They devised means, however, to confine a light by laminating i-type Si epitaxial layers equal in width in the upper and lower portions of the light absorbing layer so as to form a clad.

In the case of the photodetector developed by A. Splett and et al., a light is efficiently guided by providing the optical waveguide between a light incident surface and the photodiode and forming evanescent wave coupling for the light absorbing layer.

In Japanese Non-examined Patent Publication No. 7-231113, the applicant of the present invention disclosed a technology for providing a recessed part with an insulating film formed on its wall side in a silicon substrate surface, and despositing a Si/SiGe super-lattice layer in this recessed part by means of an ultra high vacuum CVD method (UHVCVD method) and using this as a light absorbing layer for a photodiode.

FIG. 3 is a plan view showing the structure of a photodetector disclosed in Japanese Non-examined Patent Publication No. 7-231113. FIG. 4 is a section view taken along the line X-X' of FIG. 3 and FIG. 5 is a section view taken along the line Y-Y' of FIG. 4. In FIG. 3, a silicon oxide film formed on a surface of an element is not illustrated. Referring to figures, a reference numeral 81 represents a silicon substrate; 82, an N+ type buried layer; 83, an N type epitaxial layer; 84, a separation layer; 85, a P type Si epitaxial layer; 86, a Si/SiGe super-lattice layer; 87, a P type Si buffer layer; 88, a P+ type Si contact layer; 89, a silicon oxide film; 90, a contact; 91, an N+ pulling-out layer; 92, an aluminum electrode; 93, an optical fiber fixing groove; 94, an optical fiber; and 95, a silicon chip.

In this photodetector, an incident light from the optical fiber 94 is caused to be made incident from the side of the Si/SiGe super-lattice layer 86. The N+ type buried layer 82 and the N type epitaxial layer 83 are formed on the P type silicon substrate 81 and the separation region 84 is provided so as to reach the N+ buried layer 82 from the surface of the N type epitaxial layer 83. By eliminating the N type epitaxial layer 83 in a region divided by the separation region 84, the P type Si epitaxial layer 85, the Si/SiGe super-lattice layer 86, the P type Si buffer layer 87 and the P+ Si contact layer 88 are sequentially formed by selective epitaxial growing technique on the N+ type buried layer 82. The optical fiber fixing groove 93 is formed, having a depth which allows about half of the optical fiber 94 to be buried, and a light is introduced by means of a structure, in which the exiting end of the optical fiber and the end of the Si/SiGe super-lattice layer 86 are arranged oppositely to each other.

In addition, a terminal in an N region is pulled out by providing the N+ pulling-out layer 91, which reaches the N+ type buried layer 82 penetrating the N type epitaxial layer 83. The P+ type Si contact layer 88 and the N+ pulling-out layer 91 are connected to the aluminum electrode 92 through an opening in the surface the silicon oxide films 89. This photodetector is constructed to be a completely planar type, not including any optical waveguides.

For the foregoing photodetector devised by B. Jalali and et al., a problem lies in the fact that as the i-type epitaxial layers of 1 µm and higher are needed in the upper and lower portions of the Si/SiGe super-lattice layer, it takes a longer period for growing. This is because of the slower growth speed of the Si epitaxial layer compared with the SiGe layer. Also, since this i-type Si epitaxial layer has no sensitivity to a light at a 1.3 µm band, it does not contribute to facilitate light absorption.

Furthermore, for the foregoing photodetector devised by A. Splett and et al., a problem lies in the fact that since silicon has no sensitivity to a light in a 1.3 μm band, the P type Si buffer layer provided on the Si/SiGe super-lattice layer does not facilitate light absorption.

SUMMARY OF THE INVENTION

An object of the present invention is to provide a photo-detection semiconductor device, whereby light absorbing efficiency is increased and productivity is increased by shortening a period necessary for manufacturing a photodiode.

The photodetection semiconductor device provided by the present invention is summarized as follows. The photodetection semiconductor device having a photodiode formed on a silicon substrate comprises a Si/SiGe super-lattice layer for forming a layer in parallel with the surface of the silicon substrate and SiGe epitaxial layers in upper and lower portions sandwiching the Si/SiGe super-lattice layer between them, all of which serve as light absorbing layers for the photodiode. Ge concentration in the SiGe epitaxial layer is set lower than that of the Si/SiGe super-lattice layer.

A highly dense first conductive type epitaxial layer may be directly formed on the SiGe epitaxial layer in the upper portion and a highly dense second conductive type epitaxial layer may be formed immediately below the SiGe epitaxial layer in the lower portion.

Preferably, Ge concentration in each of the SiGe epitaxial layers in the upper and lower portions is set to at least 1% or higher.

The impurity concentration of the Si/SiGe super-lattice layer and the SiGe epitaxial layers in the upper and lower portions may be set to be $1 \times 10^{16}$ cm$^{-3}$ or less, the impurity concentration including nondope.

In addition, the photodiode may be structured in a planar form and alternatively in a mesa form.

Since the SiGe epitaxial layers are respectively provided in the upper and lower portions, sandwiching the Si/SiGe super-lattice layer between them, and the Ge concentration in each of the SiGe epitaxial layers in the upper and lower portion is set lower than that of the SiGe super-lattice layer, the semiconductor device has a structure having a refractive index which becomes smaller toward the outside of the light absorbing layer. As a result, a light can be confined in the photodiode and not only the Si/SiGe super-lattice layer but also the SiGe epitaxial layers in the upper and lower portions facilitate light absorption. Accordingly, quantum efficiency can be increased for the whole photodiode.

Furthermore, since setting of the Ge content in the SiGe epitaxial layer to at least 1% or higher results in a faster growth speed compared with that for the Si epitaxial layer, it is possible to shorten the period for manufacturing a photodiode, thereby increasing productivity.

The above and other object, features, and advantages of the present invention will be apparent from the following description based on the accompanying drawings which illustrate an example of a preferred embodiment of the present invention.

DETAILED DESCRIPTION OF THE PREFERRED EMBODIMENTS

Figure 6:
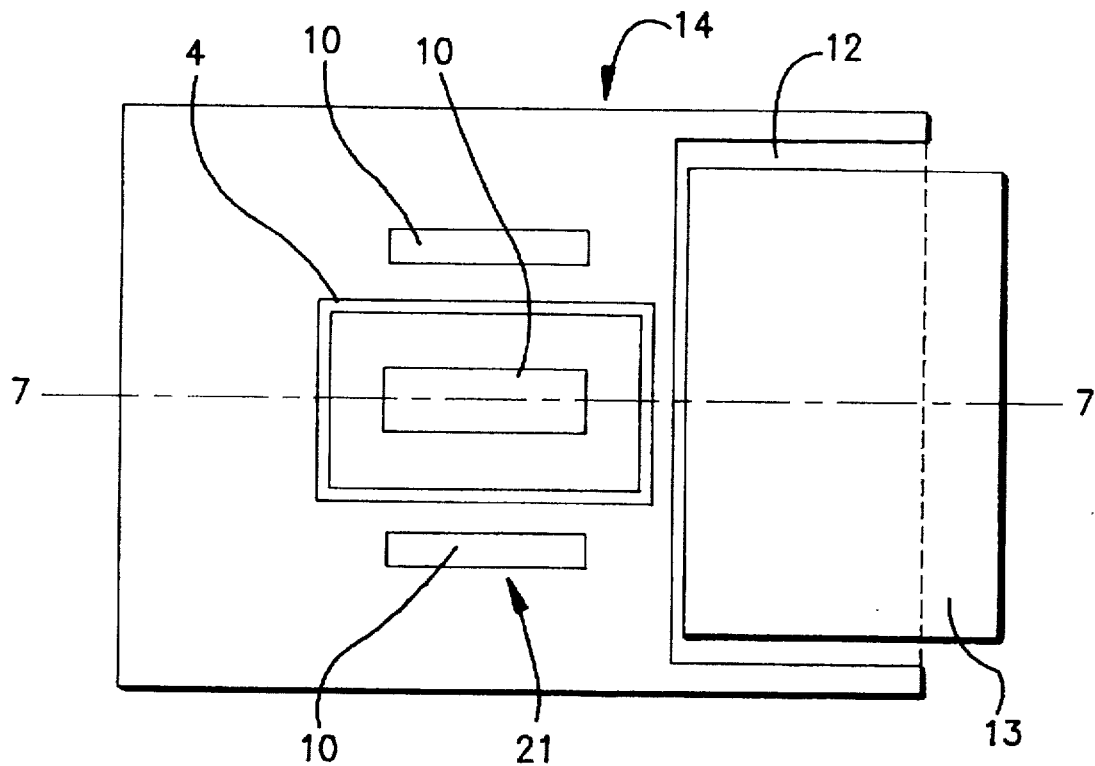
FIG. 6 is a plan view of a semiconductor device of a first embodiment of the present invention.
Figure 7:
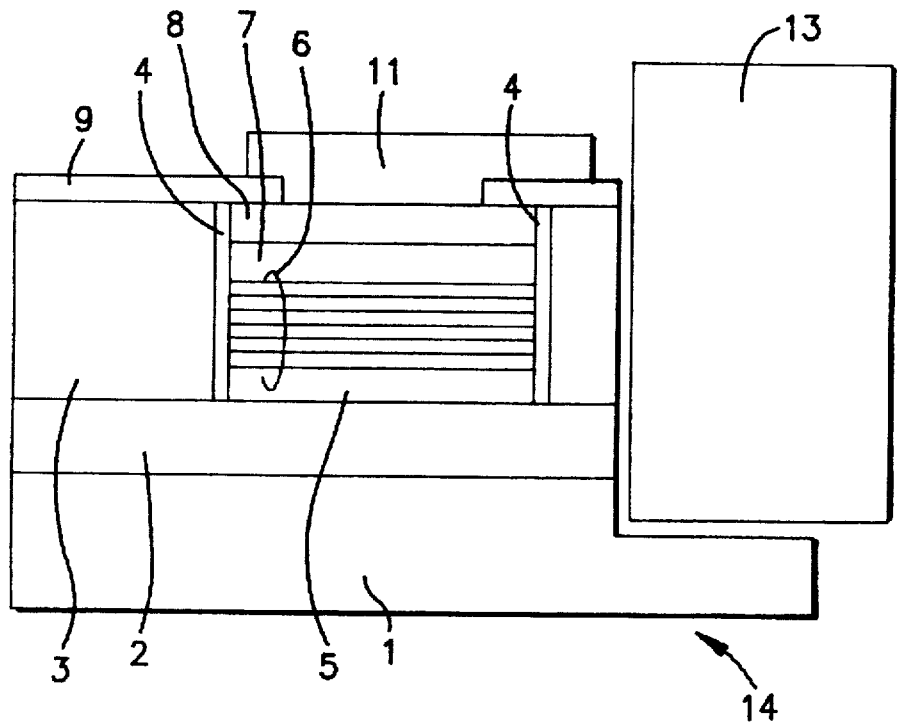
FIG. 7 is a section view taken along a line A-A' of FIG. 6.

The preferred embodiments of the present invention will now be described with reference to the accompanying drawings. FIG. 6 is a plan view showing a semiconductor device of a first embodiment of the present invention, which omits illustrations of a pulling-out aluminum electrode and a silicon oxide film covering a surface. FIG. 7 is a section view taken along a line A-A' of FIG. 6. Referring to the figures, a reference numeral 1 represents a silicon substrate; 2, an N+ type buried layer as a highly dense second conductive type epitaxial layer; 3, an N type epitaxial layer; 4, a silicon oxide film; 5, a lower P type low Ge concentration SiGe epitaxial layer; 6, a Si/SiGe super-lattice layer; 7, an upper P type low Ge concentration SiGe epitaxial layer; 8, a P+ type Si contact layer as a highly dense first conductive type epitaxial layer; 9, a silicon oxide film; 10, a contact; 11, an aluminum electrode; 12, an optical fiber fixing groove; 13, an optical fiber; 14, a silicon chip; and 21, a photodiode part.

This semiconductor device is a photodetector for detecting a light made incident from the optical fiber 13, and the photodiode part 21 is formed in a complete planar structure in the silicon chip 14. The N+ type buried layer 2 and the N type epitaxial layer 3 are sequentially grown on the silicon substrate 1 and then the photodiode part 21 is formed. The optical fiber fixing groove 12 for fixing the optical fiber 13 is formed in one end of the silicon chip 14. By forming the optical fiber fixing groove 12 deeper than the radius of the optical fiber 13, the core portion of the optical fiber comes to a position just opposite the Si/SiGe super-lattice layer 6 of the photodiode.

Next, description for the photodiode part 21 will be made. A recessed part surrounded by the silicon oxide film 4 is formed in a rectangular frame, which reaches the N+ type buried layer 2 from the surface of the N type epitaxial layer 3, and this recessed part is filled with the lower P type low Ge concentration SiGe epitaxial layer 5, the Si/SiGe super-lattice layer 6, the upper P type low Ge concentration SiGe epitaxial layer 7 and the P+ type Si contact layer 8, which are sequentially grown.

A silicon oxide film 9 as a protective film is formed in the surface of the silicon chip 14. Furthermore, the aluminum electrode 11 of the photodiode is provided via the contact 10, which is provided in the silicon oxide film 9.

Figure 8A:
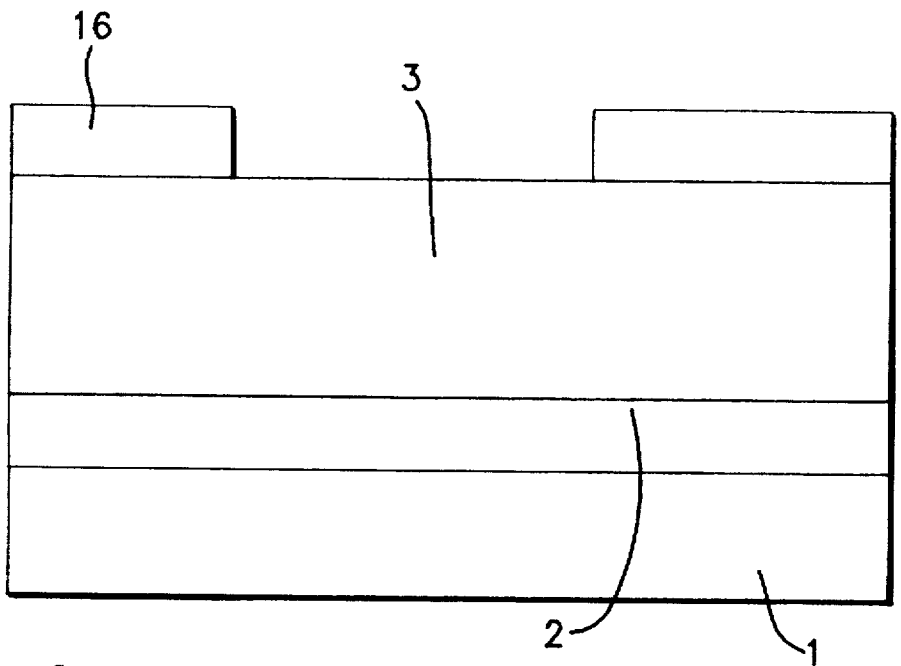
FIG. 8A is a front section view showing a manufacturing process of the semiconductor device of the first embodiment of the present invention, in which an N+ type buried layer and an N type epitaxial layer are successively grown on a silicon substrate.

Next, explanation will be made of a manufacturing process of the semiconductor device of the present invention with reference to the accompanying drawings. FIGS. 8A, 8B, 9A and 9B are front section views each showing the manufacturing process of the semiconductor device of the first embodiment of the present invention, FIG. 8A illustrating a state where the N+ type buried layer and the N type epitaxial layer are successively grown on the silicon substrate, FIG. 8B a state where the recessed part surrounded by the silicon oxide film 4 is formed in the rectangular frame reaching the N+ type buried layer from the surface of the N type epitaxial layer, FIG. 9A a state where the photodiode part is formed in the recessed part, and FIG. 9B a state where the aluminum electrode and the photosensitive polyimide film are formed. In the drawings, a reference numeral 16 represents a silicon oxide film, 17 a recessed part for forming of the photodiode, and the same reference numerals are used for the same parts as those shown in FIG. 7.

First, as shown in FIG. 8A, the N+ type buried layer 2 is formed on the P type silicon substrate 1, and further thereon, the N type epitaxial layer 3 is grown, having a thickness set to, for instance 3 to 4 μm.

Figure 8B:
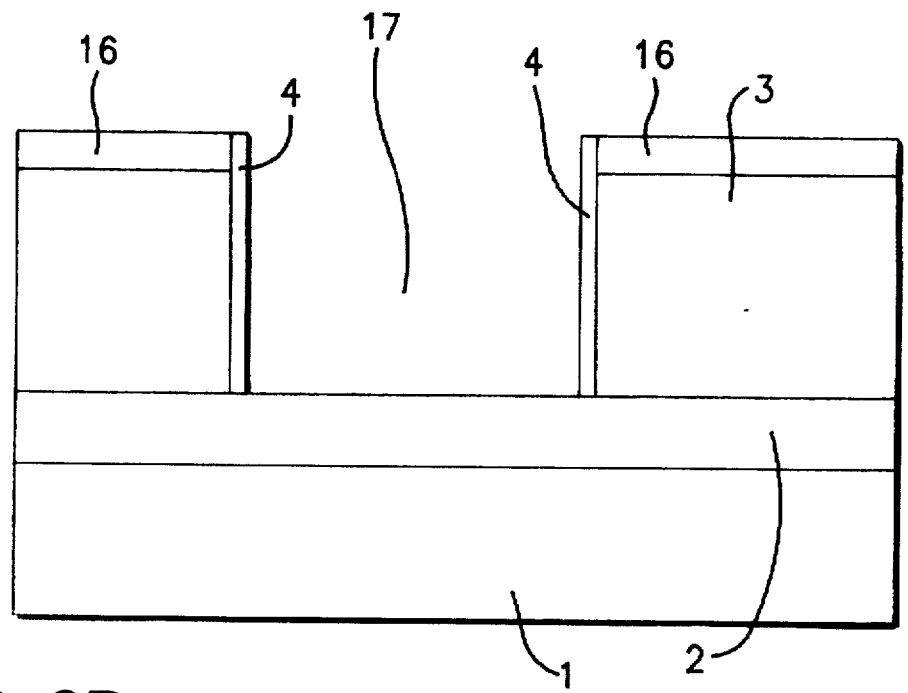
FIG. 8B is a view showing a state where a recessed part surrounded by a silicon oxide film is formed in a rectangular frame reaching the N+ type buried layer from a surface of the N type epitaxial layer.

Subsequently, as shown in FIG. 8B, silicon etching is performed for the N type epitaxial layer 3 in a position, in which the photodiode part 21 is formed, and the recessed part 17 for forming of the photodiode is formed so as to have a depth of about 3 to 4 μm. The silicon oxide film 4 is formed in the side wall of the diode forming recessed part 17. In this case, all the surfaces of the N type epitaxial layer 3 need to be covered by the silicon oxide layer 4.

Figure 9A:
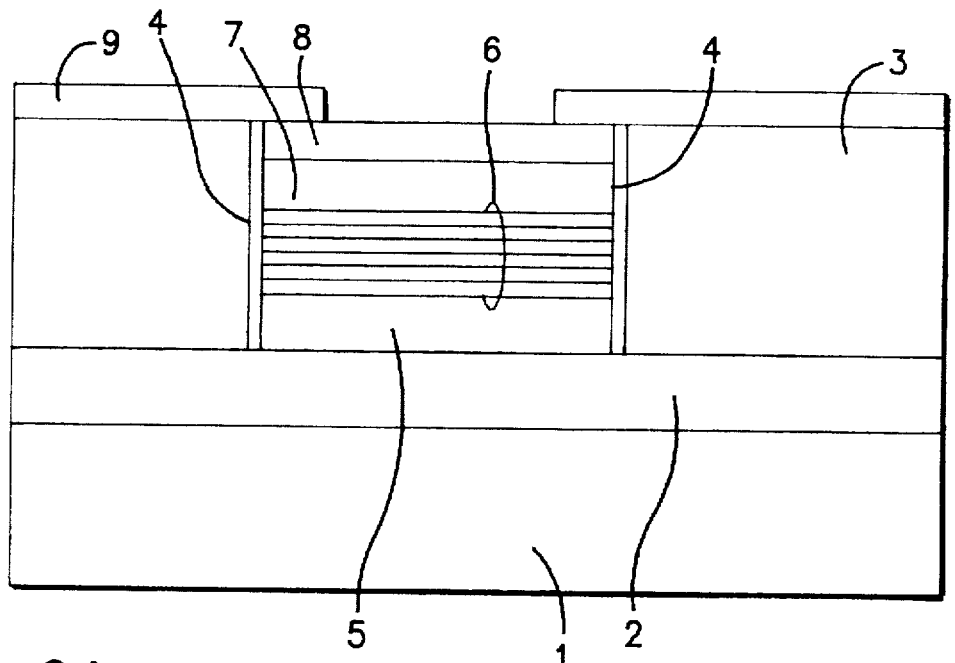
FIG. 9A is a front section view showing a manufacturing process of the semiconductor device of the first embodiment of the present invention, in which a photodiode part is formed in the recessed part.

Then, as shown in FIG. 9A, by utilizing oxide film selection, the lower P type low Ge concentration SiGe epitaxial layer 5, the Si/SiGe super-lattice layer 6, the upper P type low Ge concentration SiGe epitaxial layer 7 and the P+ type Si contact layer 8 are continuously and selectively grown on the N+ type buried layer 2, which is exposed in the bottom part of the diode forming recessed part 17. The thickness of each of the lower and upper P type low Ge concentration SiGe epitaxial layers 5 and 7 is set to about 1 μm, having a Ge content of about 1 to 2%. And a Ge content of Si/SiGe supper-lattice layer 6 is about 30% in this case.

After a part of each of the silicon oxide films 16 and 4 covering the surfaces is eliminated by means of, for instance wet etching, the silicon oxide film 9 is grown on the full surface so as to serve as a protective film for the surface of the silicon chip 14.

Figure 9B:
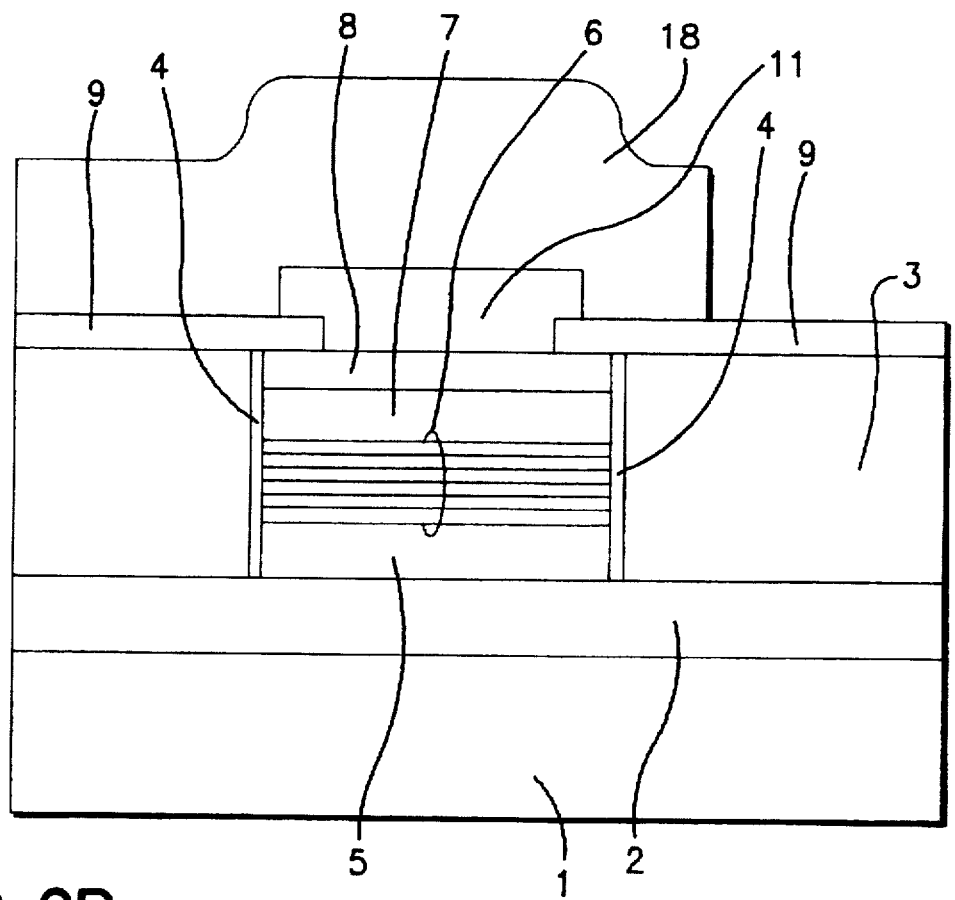
FIG. 9B is a view showing a state where an aluminum electrode and a photosensitive polyimide film for masking are formed.

Then, as shown in FIG. 9B, the aluminum electrode 11 is provided in the opened silicon oxide film 9. Since etching in next step is relatively deep, film forming and patterning are performed by using the photosensitive polyimide film 18 as a masking material, and lastly the optical fiber fixing groove 12 like that shown in FIG. 7 is formed by means of etching. At this time, if the optical fiber 13 is a single mode fiber for a 1.3 μm band, since its fiber diameter is about 125 μm, the core part of the optical fiber 13 needs to correspond to the light absorbing layer with the depth of the optical fiber fixing groove 12 set to about 65 μm.

After the foregoing steps, a photodetector is completed by fixing the optical fiber 13 in the optical fiber fixing groove 12.

Figure 12A:
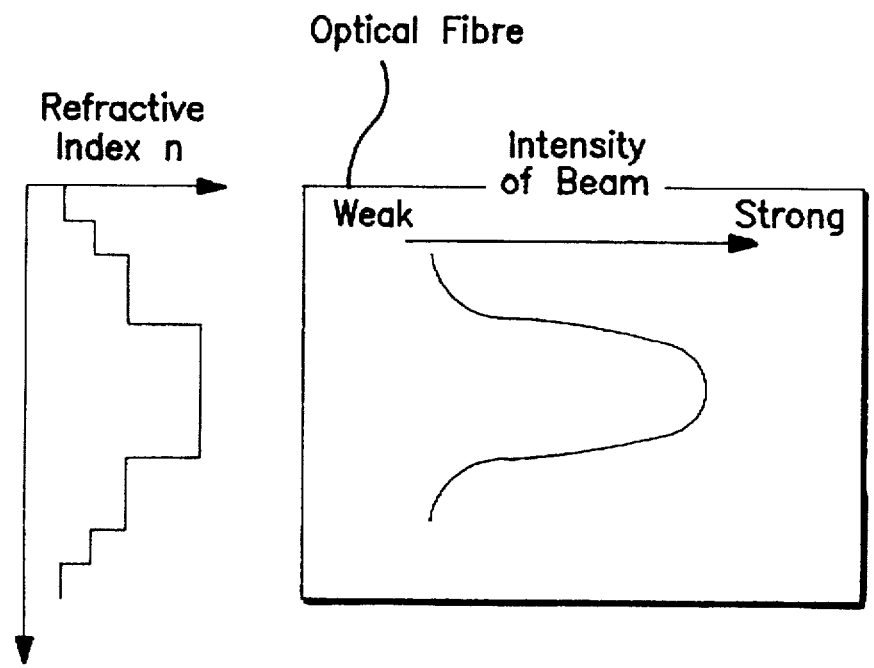
FIG. 12A is a graph showing a relationship between a refractive index and a light intensity distribution in an optical fiber.
Figure 12B:
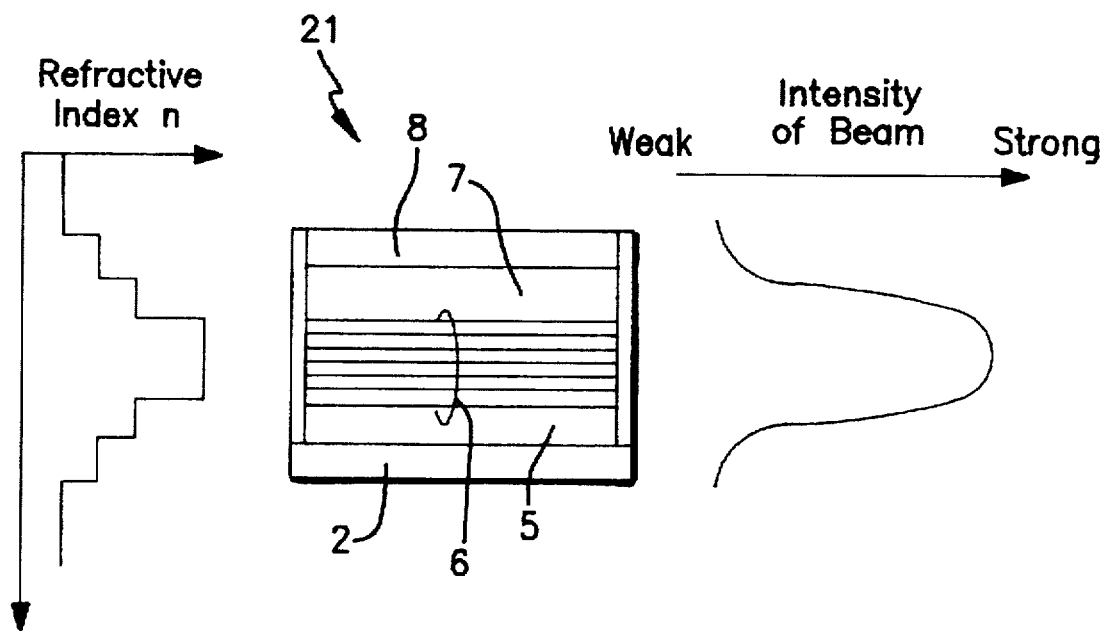
FIG. 12B is a graph showing a relationship between a refractive index and a light intensity distribution in the semiconductor device of the present invention.

Next, explanation will be made of an operation of the semiconductor device of the embodiment of the present invention with reference to FIGS. 12A and 12B. FIGS. 12A and 12B are graphs each showing a relationship between a refractive index and a light intensity distribution, FIG. 12A showing the relationship in the optical fiber and FIG. 12B showing the relationship in the semiconductor device of the present invention. In the drawings, the same reference numerals are used for the same parts as those shown in FIGS. 6 and 7.

Generally, when being conducted through the optical fiber, as shown in FIG. 12A, a light has a certain fixed intensity distribution so that its intensity is biggest in the center of the core and gradually weakened toward the outside. This is because of the structure, whereby a refractive index becomes smaller from the core center of the optical fiber toward the outside.

Supposing that a Ge content in SiGe be x, a refractive index is obtained by an expression, h=3.5+0.38 x. Similarly, when P type low Ge concentration SiGe epitaxial layers are grown in the photodiode so as to sandwich the Si/SiGe super-lattice layer between them as taught by the present invention, a light is confined in the photodiode, having an intensity distribution like that shown in FIG. 12B.

If silicon layers are grown in upper and lower portions as in the prior art, having no sensitivity to a light in the 1.3 μm band, a portion in the bottom of the distribution shown in FIG. 12B makes no contribution to light absorption. However, by containing Ge, as taught by the present invention, even a portion in the bottom can absorb a light, increasing the quantum efficiency of the photodiode.

If a Ge content in each of the P type low Ge concentration SiGe epitaxial layers 5 and 7 is 1% or higher, growth speed is much faster than a Si epitaxial layer, productivity is thereby increased.

Furthermore, in order to avoid a limitation in circuit designing, it is necessary to make void the Si/SiGe super-lattice layer 6 and the P type low Ge concentration SiGe epitaxial layers 5 and 7 as portions engaged in light absorption at a low voltage of about 1V, and it is preferred that an impurity density for each of these is non-doped and alternatively low, being set equal to below $1 \times 10^{16}$ cm$^{-3}$.

Figure 1:
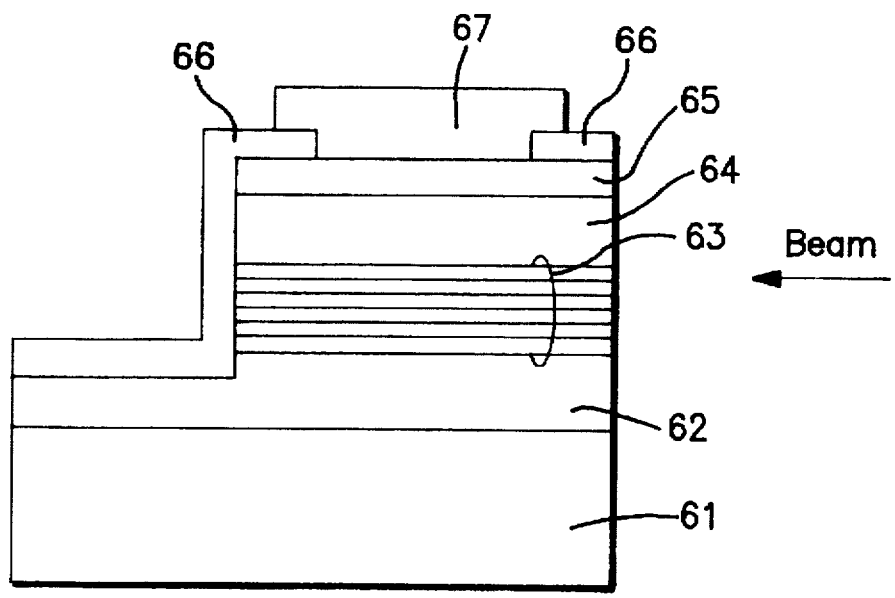
FIG. 1 is a section view showing a structure of a photodetector devised by B. Jalai and et al.
Figure 2:
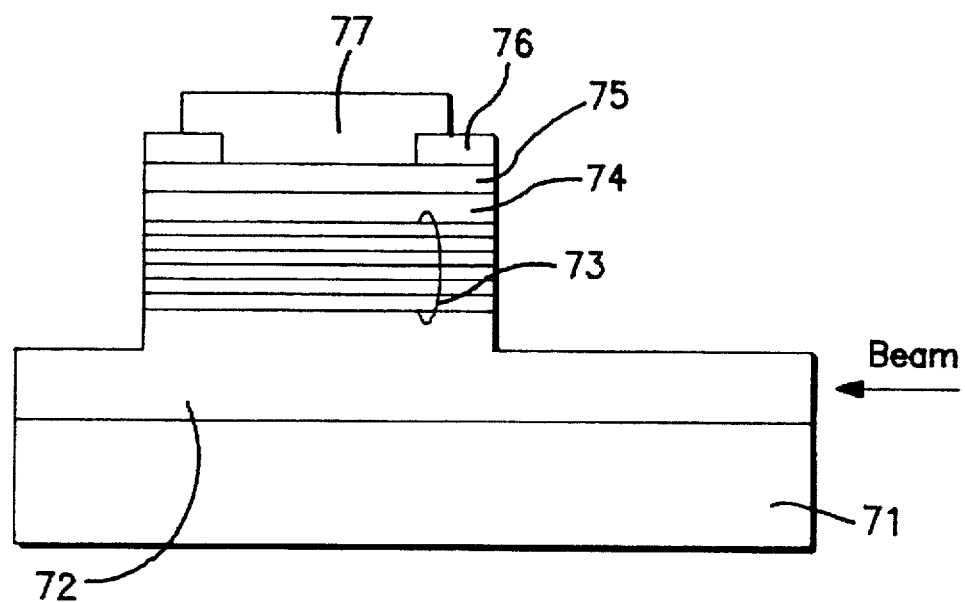
FIG. 2 is a section view showing a structure of a photodetector devised by A. Splett and et al.
Figure 3:
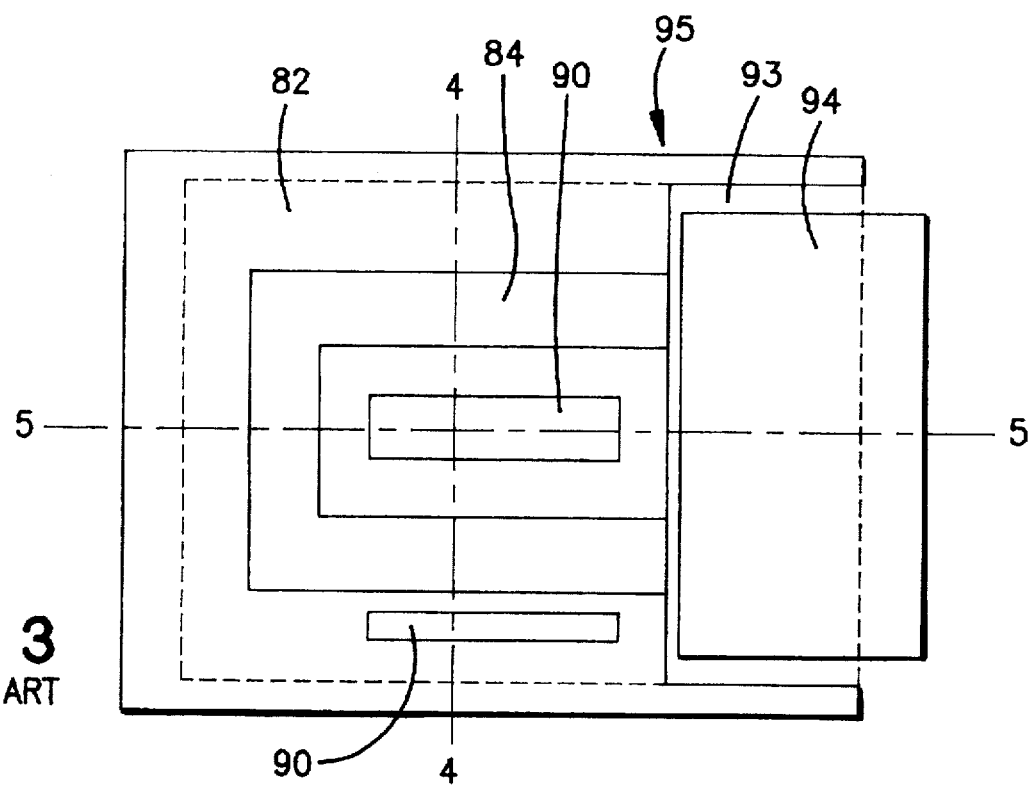
FIG. 3 is a plan view showing a structure of a photodetector disclosed in Japanese Non-examined Patent Publication No. 7-231113.
Figure 4:
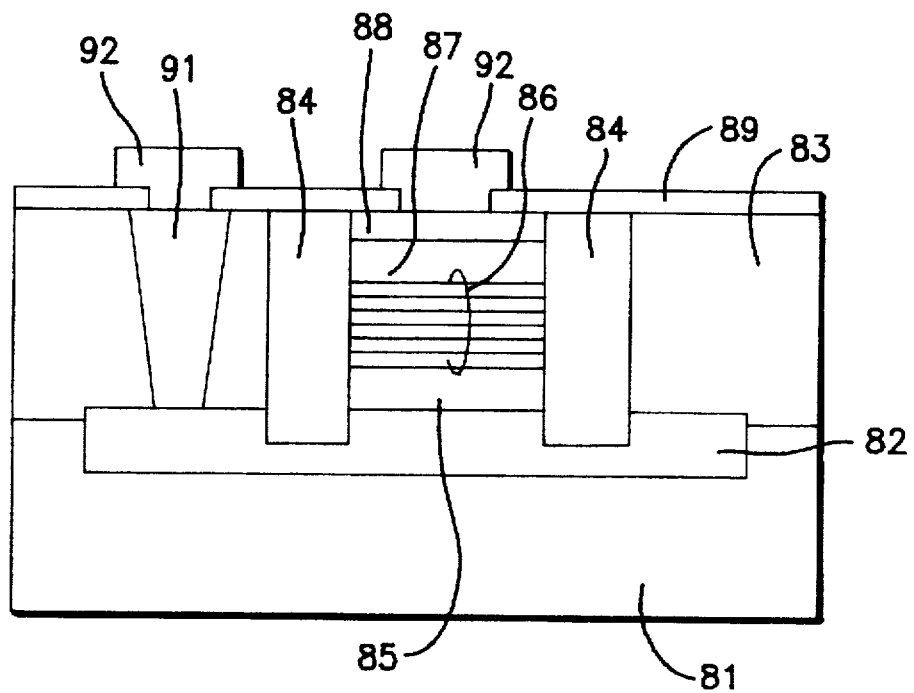
FIG. 4 is a section view taken along a line X-X' of FIG. 3.
Figure 5:
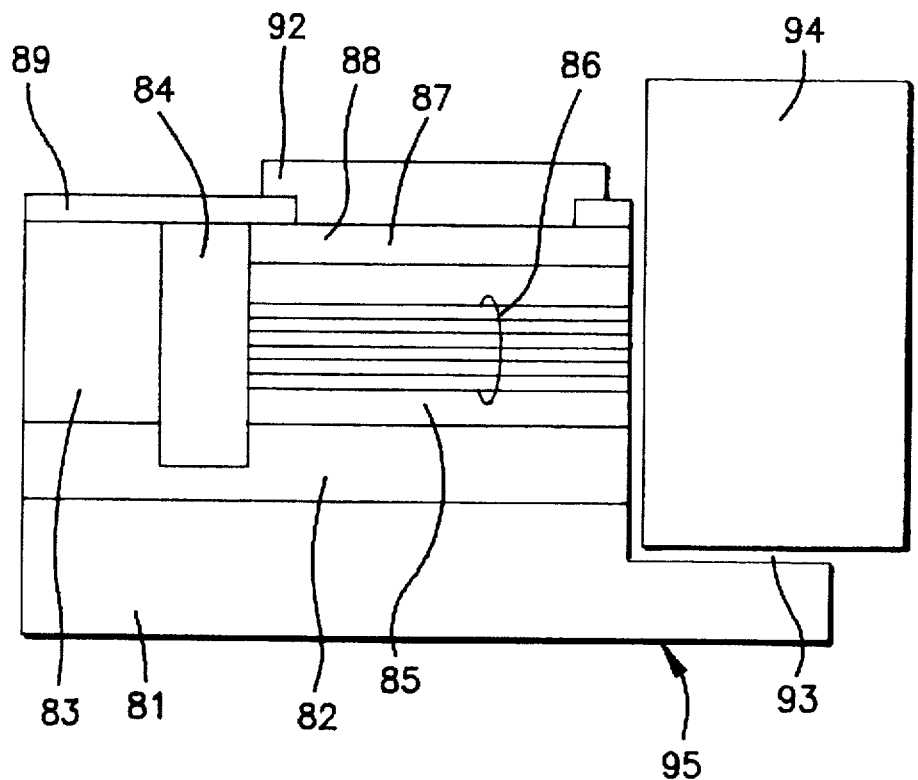
FIG. 5 is a section view taken along a line Y-Y' of FIG. 3.
Figure 10:
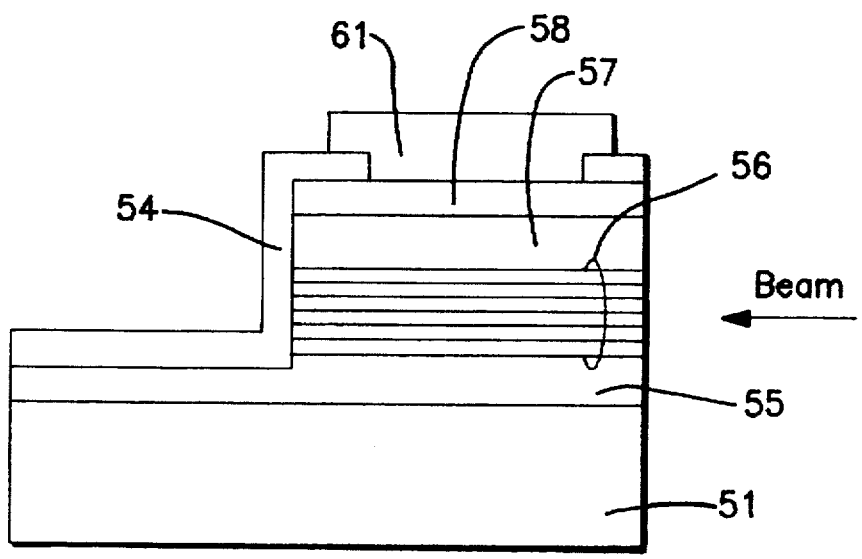
FIG. 10 is a section view of a semiconductor device of a second embodiment of the present invention.
Figure 11A:
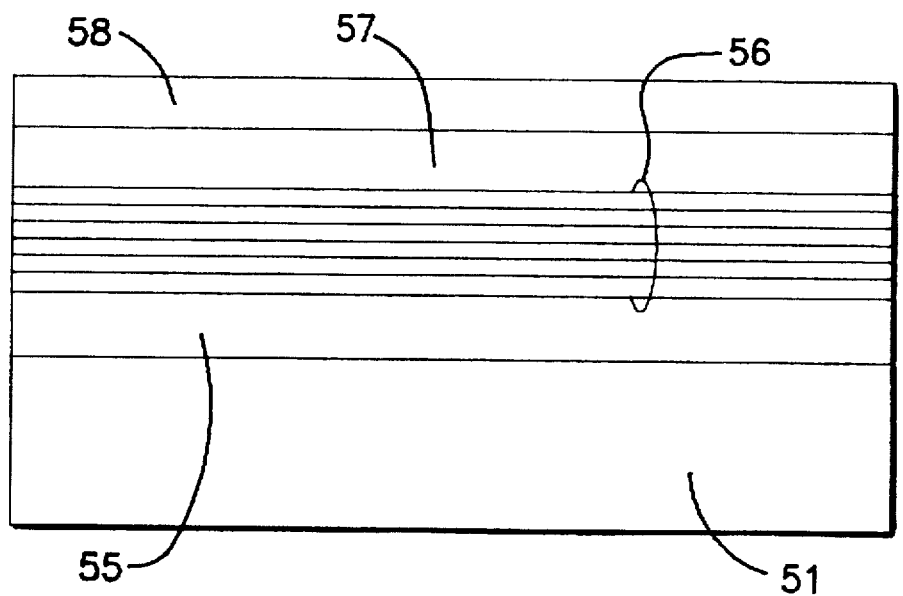
FIG. 11A is a front section view showing a manufacturing process of the semiconductor device of the second embodiment of the present invention, in which a lower P type low Ge concentration SiGe epitaxial layer, a Si/SiGe super-lattice layer, an upper P type low Ge concentration SiGe epitaxial layer and an N+ Si contact layer are successively grown on a silicon substrate.
Figure 11B:
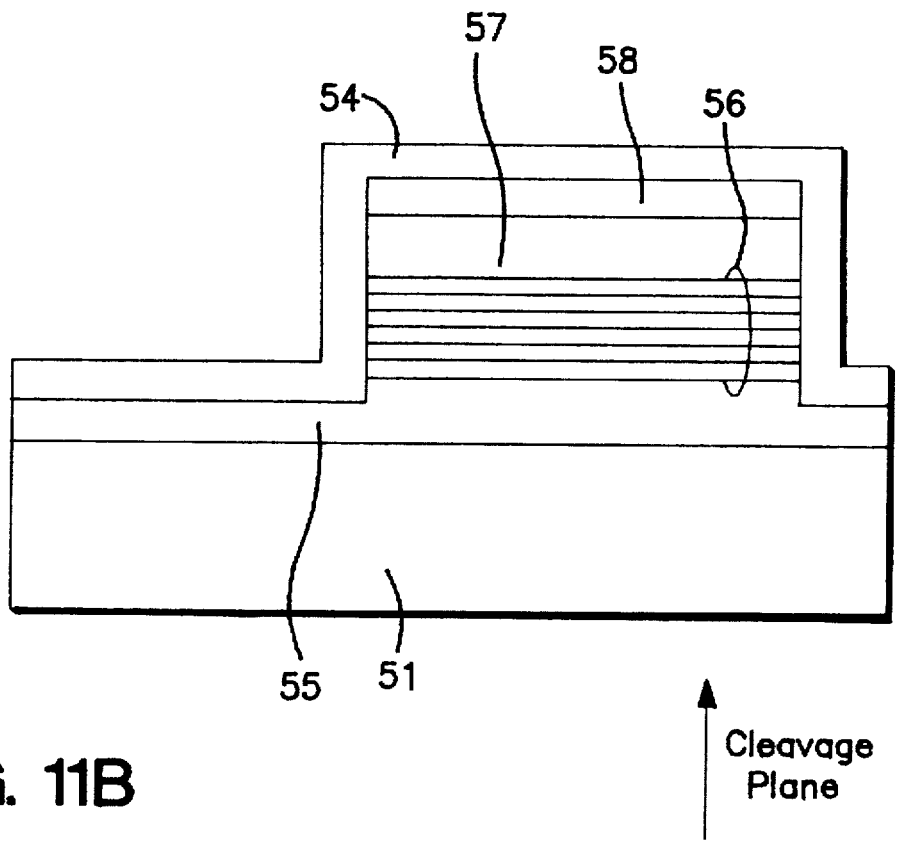
FIG. 11B is a view showing a state where etching is performed up to a lower P type low Ge concentration SiGe epitaxial layer in a mesa form and then etched parts are covered by a silicon oxide film.

Next, a second embodiment of the present invention will be described with reference to the accompanying drawings. FIG. 10 is a section view of a semiconductor device of the second embodiment of the present invention, and FIGS. 11A and 11B are front section views each showing a manufacturing process of the semiconductor device of the second embodiment of the present invention. Specifically, FIG. 11A illustrates a state where a lower P type low Ge concentration SiGe epitaxial layer, an Si/SiGe super-lattice layer, an upper P type low Ge concentration SiGe epitaxial layer and an N+ type Si contact layer are successively grown on a silicon substrate. FIG. 11B illustrates a state where etching is performed for parts up to a lower P type low Ge concentration SiGe epitaxial layer in a mesa form, and then these are covered by a silicon oxide film. In the drawings, a reference numeral 51 represents a P+ type silicon substrate, 54 a silicon oxide film, 55 a lower P type low Ge concentration SiGe epitaxial layer, 56 an Si/SiGe super-lattice layer, 57 an upper P type low Ge concentration SiGe epitaxial layer, 58 an N+ Si contact layer and 61 an aluminum electrode.

In the second embodiment, a photodetector is constructed in such a manner that a photodiode part is patterned in a mesa form. After the lower P type low Ge concentration SiGe epitaxial layer 55, the Si/SiGe super-lattice layer 56, the upper P type low Ge concentration SiGe epitaxial layer 57 and the N+ Si contact layer 58 are successively grown on the P+ type silicon substrate 51, etching is performed up to the lower P type low Ge concentration SiGe epitaxial layer 55, the etched parts are covered by the silicon oxide film 54, an opening is created in the silicon oxide film 54 on the N+ Si contact layer 58, and the aluminum electrode 61 is fitted therein.

An end surface for introducing a light is obtained by cleaving a silicon chip. In this case, a difference from the first embodiment is that selective growth is not necessary and manufacturing is relatively easy. Moreover, a light confining effect and an effect for light absorption can be obtained almost similarly to the first embodiment.

Next, explanation will be made of a manufacturing process of the semiconductor device of the second embodiment by referring to the accompanying drawings. First, as shown in FIG. 11A, the lower P type low Ge concentration SiGe epitaxial layer 55, the Si/SiGe super-lattice layer 56, the upper P type low Ge concentration SiGe epitaxial layer 57 and the N+ Si contact layer 58 are successively grown on the P+ type silicon substrate 51.

Then, as shown in FIG. 11B, after etching is performed in a mesa form from the N+ Si contact layer 58 on the surface to the lower P type low Ge concentration SiGe epitaxial layer 55, in which a photodiode is to be formed, the silicon oxide film 54 is grown on all the surfaces. Subsequently, an opening is created in the silicon oxide film 54 on the N+ Si contact layer 58 and the aluminum electrode 61 as an upper electrode is provided therein.

Thereafter, in order to pull out a light incident surface, the photodiode is manufactured by cleaving a portion indicated by an arrow in FIG. 11B so as to have a structure like that shown in FIG. 10.

As apparent from the foregoing, according to the present invention, since the P type low Ge concentration SiGe epitaxial layers are provided in the upper and lower portions so as to sandwich the Si/SiGe super-lattice layer between them, and the Ge concentration in each of the upper and lower SiGe epitaxial layers is set lower than that in the Si/SiGe super-lattice layer, resulting in a smaller refractive index toward the outside of the light absorbing layer, it is possible to confine a light in the photodiode. Specifically, since a refractive index becomes larger as the Ge content in the SiGe layer increases, it is difficult for a light guided to the light absorbing layer to escape to the outside.

Furthermore, not only the Si/SiGe super-lattice layer but also the upper and lower SiGe epitaxial layers facilitate light absorption. As a result, the quantum efficiency of the whole photodiode is increased. Si in the conventional example makes no contribution to light absorption.

Also, since the growth speed can be greatly increased compared with that of the Si epitaxial layer in the conventional example by setting the Ge content in the SiGe epitaxial layer to at least 1% or higher, it is possible to shorten the period for manufacturing the photodiode, increasing productivity.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A photodetection semiconductor device comprising:

a silicon substrate;

a photodiode formed on said silicon substrate;

an Si/SiGe super-lattice layer, which forms a layer in parallel with a surface of said silicon substrate and serves as a light absorbing layer for said photodiode; and SiGe epitaxial layers, which are formed in upper and lower portions, said SiGe epitaxial layers sandwiching said Si/SiGe super-lattice layer and serving as light absorbing layers for said photodiode, wherein a Ge concentration in each of said upper and lower SiGe epitaxial layers is set lower than Ge concentration in said Si/SiGe super-lattice layer.

2. A photodetection semiconductor device as claimed in claim 1, further comprising:

a high concentration epitaxial layer of a first conductivity type, said layer being formed directly on said upper SiGe epitaxial layer; and a high concentration epitaxial layer of a second conductivity type, said layer being formed immediately below said lower SiGe epitaxial layer.

3. A photodetection semiconductor device as claimed in claim 1, in which Ge concentration in each of said upper and lower SiGe epitaxial layers is set to be at least 1% or higher.

4. A photodetection semiconductor device as claimed in claim 1, in which an impurity concentration in each of said Si/SiGe super-lattice layer and said upper and lower SiGe epitaxial layers is one of $1 \times 10^{16}$ cm$^{-3}$ or lower and non-doped.

5. A photodetection semiconductor device as claimed in claim 3, in which an impurity concentration in each of said Si/SiGe super-lattice layer and said upper and lower SiGe epitaxial layers is one of $1 \times 10^{16}$ cm$^{-3}$ or lower and non-doped.

6. A photodetection semiconductor device as claimed in claim 1, in which said photodiode is formed in a planar structure.

7. A photodetection semiconductor device as claimed in claim 1, in which said photodiode is formed in a mesa structure.

* * * * *